United States Patent
Pinarbasi (10) Patent No.: US 7,428,129 B2
(45) Date of Patent: Sep. 23, 2008

(54) METHODS AND APPARATUS FOR IMPROVED HARD MAGNET PROPERTIES IN MAGNETORESISTIVE READ HEADS USING A MULTI-LAYERED SEED LAYER STRUCTURE

(75) Inventor: Mustafa Michael Pinarbasi, Morgan Hill, CA (US)

(73) Assignee: Hitachi Global Storage Technologies Amsterdam (NL)

( * ) Notice: Subject to any disclaimer, the term of this patent is extended or adjusted under 35 U.S.C. 154(b) by 784 days.

(21) Appl. No.: 10/881,062

(22) Filed: Jun. 30, 2004

(65) Prior Publication Data
US 2006/0002041 A1  Jan. 5, 2006

(51) Int. Cl.
*G11B 5/127* (2006.01)

(52) U.S. Cl. .................................. 360/324.12
(58) Field of Classification Search ........................ None
See application file for complete search history.

(56) References Cited

U.S. PATENT DOCUMENTS

| | | | |
|---|---|---|---|
| 5,742,459 | A | 4/1998 | Shen et al. |
| 6,185,081 | B1 | 2/2001 | Simion et al. |
| 6,219,207 | B1 * | 4/2001 | Pinarbasi ............... 360/322 |
| 6,351,357 | B1 | 2/2002 | Xue et al. |
| 6,477,020 | B1 | 11/2002 | Aoshima et al. |
| 6,511,761 | B1 | 1/2003 | Tanahashi et al. |
| 6,636,400 | B2 | 10/2003 | Pinarbashi et al. |
| 6,873,500 | B2 * | 3/2005 | Hasegawa et al. ...... 360/324.11 |
| 6,979,500 | B2 * | 12/2005 | Hasegawa et al. ......... 428/811.2 |
| 6,980,403 | B2 * | 12/2005 | Hasegawa ................. 360/319 |
| 2002/0181171 | A1 | 12/2002 | Chien et al. |
| 2003/0026047 | A1 | 2/2003 | Chien et al. |
| 2003/0030947 | A1 | 2/2003 | Ooshima |
| 2003/0048585 | A1 | 3/2003 | Gill |
| 2003/0058586 | A1 | 3/2003 | Pinarbasi et al. |
| 2003/0099869 | A1 | 5/2003 | Oikawa et al. |
| 2004/0033390 | A1 | 2/2004 | Oikawa et al. |

FOREIGN PATENT DOCUMENTS

| JP | 10154619 | 6/1998 |
|---|---|---|
| JP | 2000132817 | 5/2000 |

OTHER PUBLICATIONS

Nirupama Sharma, "Effect of Seedlayer and Junction Geometry on Permanent Magnet Stabilization of Magnetoresistive Heads", IEEE Transactions on Magnetics, Sep. 2000, pp. 2496-2498, vol. 36, # 5.

* cited by examiner

*Primary Examiner*—Joseph Feild
*Assistant Examiner*—Mark Blouin
(74) *Attorney, Agent, or Firm*—John J. Oskorep, Esq.; Rambod Nader (57) ABSTRACT

A magnetic head with improved hard magnet properties includes a read sensor; a multi-layered seed layer structure in end regions adjacent the read sensor; and a multi-layered seed layer structure formed upon crystalline materials of the read sensor in the end regions. The multi-layered seed layer structure includes a first seed layer made of chromium-molybdenum (Cr—Mo); a second seed layer made of nickel-tantalum (Ni—Ta); and a third seed layer made of chromium-molybdenum (Cr—Mo). The hard bias layer is preferably cobalt-platinum-chromium (Co—Pt—Cr).

33 Claims, 7 Drawing Sheets

METHODS AND APPARATUS FOR IMPROVED HARD MAGNET PROPERTIES IN MAGNETORESISTIVE READ HEADS USING A MULTI-LAYERED SEED LAYER STRUCTURE

BACKGROUND OF THE INVENTION

1. Field of the Invention

This invention relates generally to magnetic read heads having read sensors for reading information signals from a magnetic medium, and more particularly to an improved seed layer structure for hard bias layers formed adjacent the read sensor where the seed layer structure is formed over crystalline materials of the read sensor.

2. Description of the Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read (MR) sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer. The conventional MR sensor operates on the basis of the anisotropic magnetoresistive (AMR) effect in which the MR element resistance varies as the square of the cosine of the angle between the magnetization of the MR element and the direction of sense current flow through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage. Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., nickel-iron (Ni—Fe), cobalt (Co), or nickel-iron-cobalt (Ni—Fe—Co)) separated by a layer of nonmagnetic material (e.g., copper (Cu)) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (e.g., nickel-oxide (Ni—O), iron-manganese (Fe—Mn) or platinum-manganese (Pt—Mn)) layer.

The magnetization of the other ferromagnetic layer, referred to as the free layer, however, is not fixed and is free to rotate in response to the field from the information recorded on the magnetic medium (the signal field). In the SV sensors, SV resistance varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. In addition to the magnetoresistive material, the MR sensor has conductive lead structures for connecting the MR sensor to a sensing means and a sense current source. Typically, a constant current is sent through the MR sensor through these leads and the voltage variations caused by the changing resistance are measured via these leads.

Figure 1:
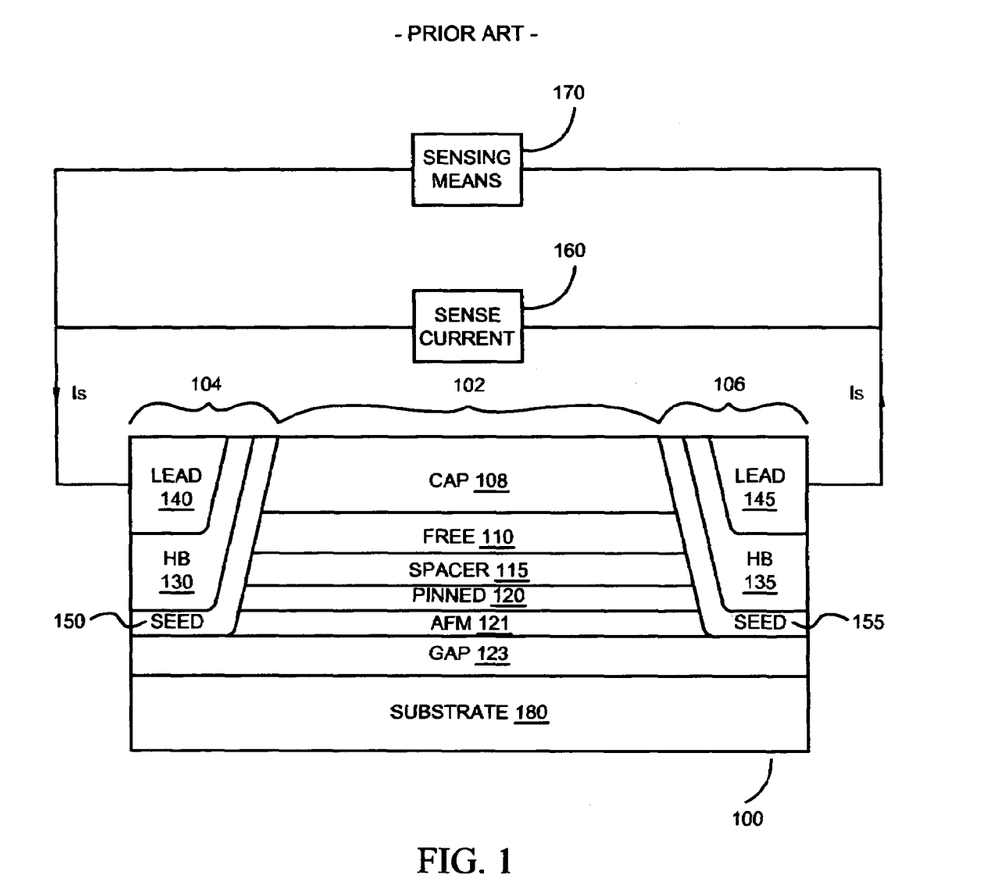
FIG. 1 is a schematic diagram of an air-bearing surface (ABS) view of the thin film structure of a prior art SV sensor device.

To illustrate, FIG. 1 shows a prior art SV sensor 100 comprising end regions 104 and 106 separated by a central region 102. A free layer 110 is separated from a pinned layer 120 by a non-magnetic, electrically-conducting spacer 115. The magnetization of pinned layer 120 is fixed by an AFM pinning layer 121, which is formed on a gap layer 123 residing on a substrate 180. Cap layer 108, free layer 110, spacer layer 115, pinned layer 120, and AFM pinning layer 121 are all formed in central region 102. Gap layer 123 is typically an insulator layer made of an amorphous material such as alumina $(Al_2O_3)$.

Conventionally, hard bias layers 130 and 135 are formed in end regions 104 and 106 in order to stabilize free layer 110. These hard bias layers 130 and 135 are typically formed of a cobalt-based alloy which is sufficiently magnetized and perhaps shielded so that the magnetic fields of the media and/or the write head do not effect the magnetism of the hard magnets. Seed layers 150 and 155 are also deposited in end regions 104 and 106 underneath hard bias layers 130 and 135 to set a texture for the successful deposition of the hard magnets by promoting a desired c-axis in plane orientation. To perform effectively, hard bias layers 130 and 135 should have a high coercivity, a high MrT (magnetic remanence× thickness), and a high in-plane squareness on the magnetization curve. A preferred cobalt-based alloy for hard bias layers 130 and 135 is cobalt-platinum-chromium (Co—Pt—Cr), while seed layers 150 and 155 typically comprise chromium (Cr) or other suitable metallic element.

Thus, as illustrated in FIG. 1, seed layers 150 and 155 and hard bias layers 130 and 135 are formed in end regions 104 and 106, respectively, and provide longitudinal bias for free layer 110. Leads 140 and 145 are formed over hard bias layers 130 and 135, respectively. Seed layers 150 and 155 are formed over the amorphous materials (e.g. alumina) of gap layer 123. Seed layers 150 and 155, hard bias layers 130 and 135 and lead layers 140 and 145 also abut first and second side edges of the read sensor in a connection which is referred to in the art as a "contiguous junction". Crystalline materials such as tantalum (Ta), nickel-iron (Ni—Fe), cobalt-iron (Co—Fe), copper (Cu), platinum-manganese (Pt—Mn) and ruthenium (Ru) are exposed at first and second side edges of the contiguous junctions.

Leads 140 and 145 provide electrical connections for the flow of the sensing current $I_s$ from a current source 160 to the MR sensor 100. Sensing means 170 connected to leads 140 and 145 sense the change in the resistance due to changes induced in the free layer 110 by the external magnetic field (e.g., field generated by a data bit stored on a disk). One material for constructing the leads in both the AMR sensors and the SV sensors is a highly conductive material, such as a metal.

Figure 2:
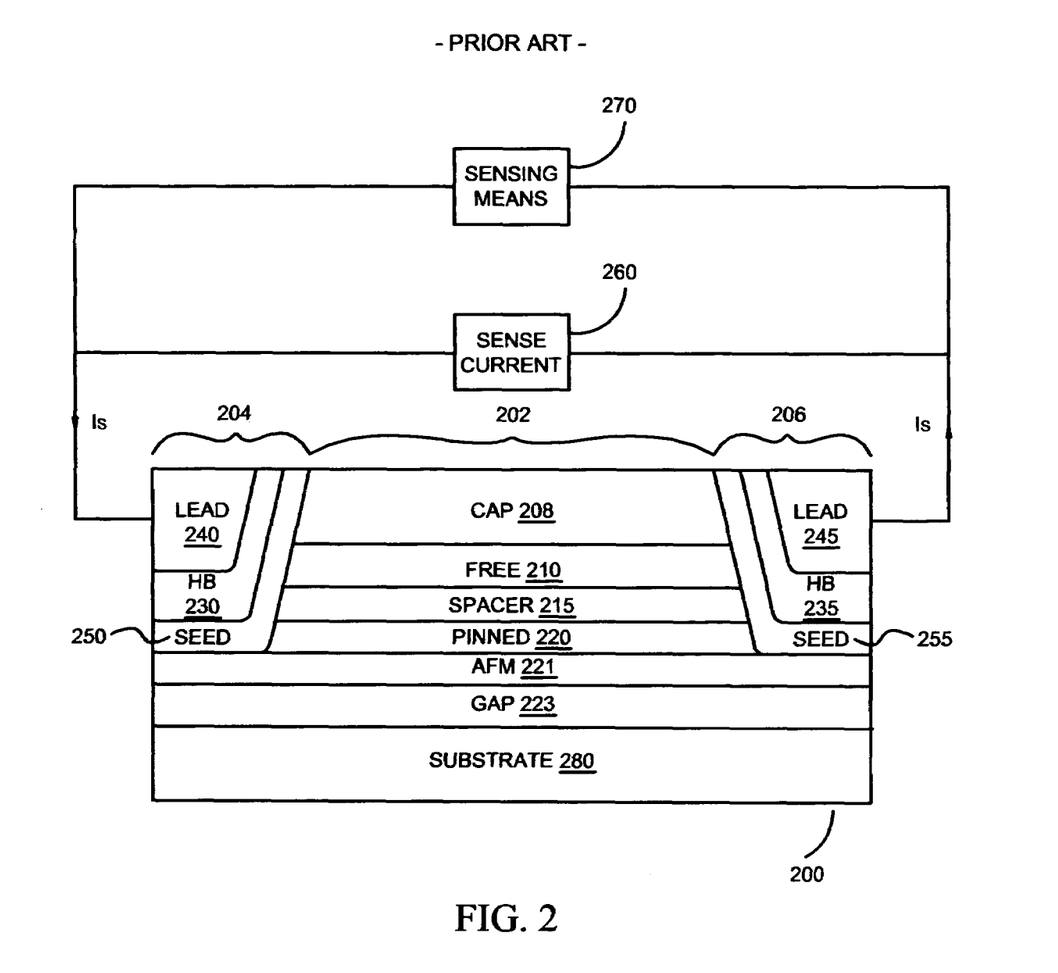
FIG. 2 is a schematic diagram of an air-bearing surface (ABS) view of the thin film structure of a partial mill prior art SV sensor device.

FIG. 2 shows a prior art SV sensor 200, similar to prior art SV sensor 100 (FIG. 1), comprising end regions 204 and 206 separated by a central region 202. A free layer 210 is separated from a pinned layer 220 by a non-magnetic, electrically-conducting spacer 215. The magnetization of pinned layer 220 is fixed by an AFM pinning layer 221, which is formed on a gap layer 223 residing on a substrate 280. Cap layer 208, free layer 210, spacer layer 215 and pinned layer 220 are all formed in central region 202.

Unlike prior art SV sensor 100 of FIG. 1, prior art SV sensor 200 of FIG. 2 is a partial mill design with materials of AFM pinning layer 221 of sensor 200 extending into end regions 204 and 206. By "partial mill design", it is meant that the read sensor layers are not fully etched or milled in end regions 204 and 206 prior to the deposition of the seed, hard bias, and lead materials. A partial mill design is desirable in order to reduce the spacing of the "read gap" (i.e. the distance from shield to shield which encapsulates the read sensor) so that the sensor's bit per inch (BPI) capability can be increased, as it reduces the possibility of electrical shorts to the shield.

As illustrated in FIG. 2, seed layers 250 and 255 and hard bias layers 230 and 235 are formed in end regions 204 and 206, respectively. Hard bias layers 230 and 235 provide longitudinal biasing for free layer 210. Leads 240 and 245 are formed over hard bias layers 230 and 235, respectively. In the partial mill design, seed layers 250 and 255 are formed directly on crystalline materials of sensor 202 which extend into end regions 204 and 206. In the example of FIG. 2, seed layers 250 are formed directly on top of materials of AFM layer 221 which extend into end regions 204 and 206. Seed layers 250 and 255, hard bias layers 230 and 235 and lead layers 240 and 245 also abut first and second side edges in end regions 204 and 206 adjacent SV sensor 200 in a contiguous junction. The crystalline materials of sensor 202 include materials such as tantalum (Ta), nickel-iron (Ni—Fe), cobalt-iron (Co—Fe), copper (Cu), ruthenium (Ru), platinum-manganese (Pt—Mn), as examples. As similarly described early in FIG. 1, leads 240 and 245 provide electrical connections for the flow of the sensing current $I_s$ from a current source 260 to the MR sensor 200. Sensing means 270 connected to leads 240 and 245 sense the change in the resistance due to changes induced in the free layer 210 by the external magnetic field.

The preferred seed layer material of chromium (Cr) and the preferred hard magnet material of cobalt-platinum-chromium (Co—Pt—Cr) formed over amorphous materials such as the gap layer of alumina ($Al_2O_3$) (see FIG. 1) or glass exhibits favorable properties for sensor biasing purposes, such as increased coercivity and squareness of the hard magnets. However, these properties degrade when deposited on crystalline materials of read sensor layers such as tantalum (Ta), nickel-iron (Ni—Fe), cobalt-iron (Co—Fe), copper (Cu), ruthenium (Ru), platinum-mangangese (Pt—Mn), etc., as in the partial mill design shown in FIG. 2.

Accordingly, what are needed are methods and apparatus for improving hard magnet properties in SV sensors when the hard magnet seed layer structure is formed over crystalline materials.

SUMMARY OF THE INVENTION

I have discovered that by utilizing a multi-layered seed layer structure having a first seed layer made of chromium-molybdenum (Cr—Mo), a second seed layer made of nickel-tantalum (Ni—Ta), and a third seed layer made of chromium-molybdenum (Cr—Mo), which are formed upon crystalline materials of read sensor layers in end regions adjacent a read sensor, improved hard magnetic properties are exhibited by a hard bias layer. In particular, the hard bias layer exhibits increased coercivity and squareness of the hard magnets as compared to prior art seed layer structures formed over crystalline materials.

More specifically, an inventive magnetic head having improved hard magnet properties includes a spin valve (SV) sensor; a multi-layered seed layer structure formed upon crystalline materials of sensor layers in end regions adjacent the sensor; and a hard bias layer formed over the multi-layered seed layer structure. The multi-layered seed layer structure includes a first seed layer made of chromium-molybdenum (Cr—Mo), a second seed layer made of nickel-tantalum or (Ni—Ta) oxidized nickel-tantalum (Ni—Ta), and a third seed layer made of chromium-molybdenum (Cr—Mo). The hard bias layer may be made from a cobalt-based alloy, such as cobalt-platinum-chromium (Co—Pt—Cr). The crystalline materials may include materials such as tantalum (Ta), nickel-iron (Ni—Fe), cobalt-iron (Co—Fe), copper (Cu), ruthenium (Ru), and platinum-manganese (Pt—Mn), as examples. A lead layer may be formed over the hard bias layer.

A hard disk drive may embody the magnetic head. This hard disk drive has at least one rotatable magnetic disk; a spindle supporting the at least one rotatable magnetic disk; a disk drive motor for rotating the at least one rotatable magnetic disk; a magnetic head for reading data from the at least one rotatable magnetic disk; and a slider for supporting the magnetic head. The magnetic head having improved hard magnet properties includes an SV sensor; a multi-layered seed layer structure formed upon crystalline materials of sensor layers in end regions adjacent the sensor; and a hard bias layer formed over the multi-layered seed layer structure. The multi-layered seed layer structure includes a first seed layer made of chromium-molybdenum (Cr—Mo), a second seed layer made of nickel-tantalum (Ni—Ta) (or top-surface-oxidized nickel-tantalum (Ni—Ta)), and a third seed layer made of chromium-molybdenum (Cr—Mo). The hard bias layer may be made from a cobalt-based alloy, such as cobalt-platinum-chromium (Co—Pt—Cr). The crystalline materials of the sensor may include materials such as tantalum (Ta), nickel-iron (Ni—Fe), cobalt-iron (Co—Fe), copper (Cu), ruthenium (Ru), and platinum-manganese (Pt—Mn), as examples. A lead layer may be formed over the hard bias layer.

Finally a method for use in forming a magnetic head includes forming a plurality of SV sensor layers over a substrate and forming a resist over the SV sensor layers in a central region. An act of milling, with the resist in place, to partially remove sensor materials in end regions adjacent the central region is performed. A multi-layered seed layer structure is then formed upon leftover crystalline materials of the sensor in the end regions. The multi-layered seed layer structure includes a first seed layer made of chromium-molybdenum (Cr—Mo), a second seed layer made of nickel-tantalum (Ni—Ta) (or top-surface-oxidized nickel-tantalum (Ni—Ta)), and a third seed layer made of chromium-molybdenum (Cr—Mo). The hard bias layer may be made from a cobalt-based alloy, such as cobalt-platinum-chromium (Co—Pt—Cr). The crystalline materials may include materials such as tantalum (Ta), nickel-iron (Ni—Fe), cobalt-iron (Co—Fe), copper (Cu), ruthenium (Ru), and platinum-manganese, as examples. A lead layer may be formed over the hard bias layer.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 3:
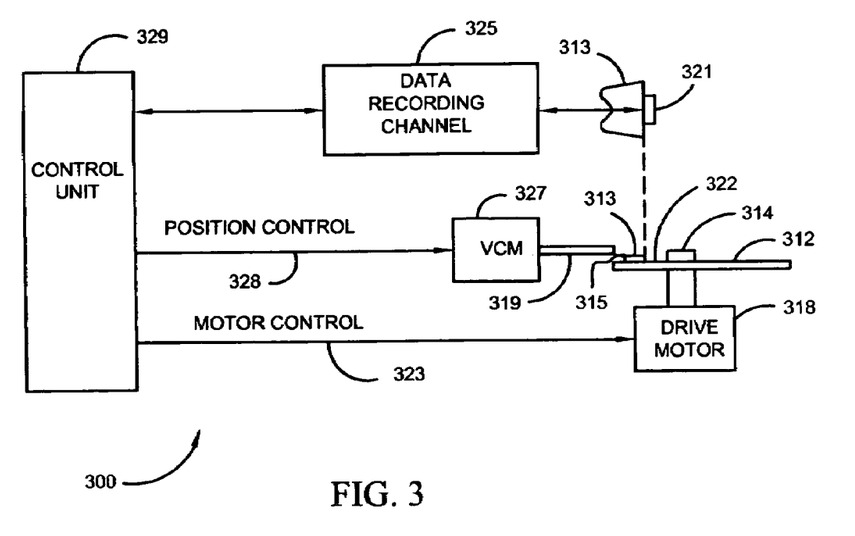
FIG. 3 is a block diagram of a magnetic recording disk drive system.

Referring to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting a magnetic read/write head 321 which incorporates the SV sensor of the present invention. As the disks rotate, slider 313 is moved radially in and out over disk surface 322 so that head 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write head 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
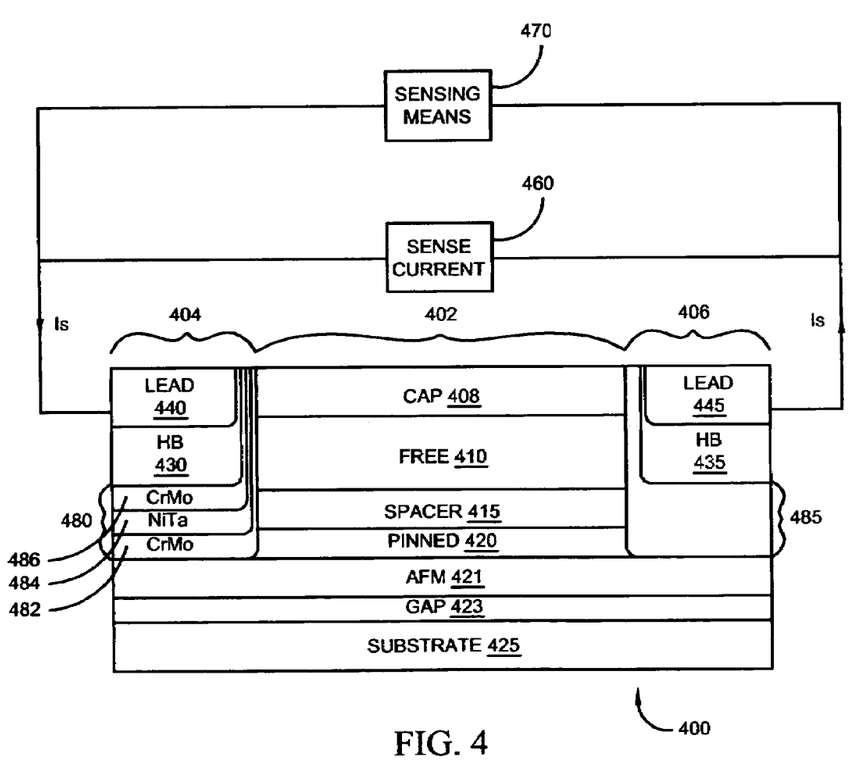
FIG. 4 is a schematic diagram of an ABS view of a thin film structure of a preferred embodiment spin valve (SV) sensor according to the present invention.

FIG. 4 shows an air bearing surface (ABS) view of the SV sensor 400 according to the preferred embodiment of the present invention. SV sensor 400 comprises end regions 404 and 406 separated by a central region 402. A free layer (free ferromagnetic layer) 410 is separated from a pinned layer (pinned ferromagnetic layer) 420 by a non-magnetic, electrically-conducting spacer layer 415. The magnetization of the pinned layer 420 is fixed by an antiferromagnetic (AFM) layer 421. Cap layer 408, free layer 410, spacer layer 415 and pinned layer 420 are all formed in central region 402.

SV sensor 400 is a "partial mill" design since AFM pinning layer 221 extends into end regions 204 and 206. That is, read sensor materials in end regions 204 and 206 are not fully (but only partially) removed from an ion milling process. A partial mill design is desirable in order to reduce the spacing of the "read gap" (i.e. the distance from shield to shield which encapsulates the read sensor) so that the sensor's bit per inch (BPI) capability can be increased), as it reduces the possibility of electrical shorts to the shield.

Hard bias layers 430 and 435 formed in the end regions 404 and 406, respectively, and more or less in contact with the spin valve sensor layers in the central region 402, provide longitudinal bias for free layer 410. Leads 440 and 445 formed over hard bias layers 430 and 435, respectively, provide electrical connections for the flow of the sensing current $I_s$ from a current source 460 to the SV sensor 400. Sensing means 470 connected to leads 440 and 445 sense the change in the resistance due to changes induced in the free layer 410 by the external magnetic field (e.g. field generated by a data bit stored on a disk).

In this embodiment, free layer 410 is formed of nickel-iron (Ni—Fe) and cobalt-iron (Co—Fe), pinned layer 420 is formed of cobalt-iron (Co—Fe), and spacer layer 415 is formed of copper (Cu). Preferably, pinned layer 420 comprises a multi-layer film structure such as a first ferromagnetic layer/spacer/second ferromagnetic layer (e.g., cobalt-iron (Co—Fe)/ruthenium (Ru)/cobalt-iron (Co—Fe)) where the first and second ferromagnetic layers are antiferromagnetically coupled by a spacer layer. AFM layer may be formed of platinum-manganese (Pt—Mn), iridium-manganese (Ir—Mn), and nickel-oxide (Ni—O).

Multi-layered seed layer structures 480 and 485, which in this embodiment are "tri-layered" seed layer structures, are formed in end regions 404 and 406, respectively. More particularly, multi-layered seed layer structures 480 and 485 are formed below hard bias layers 430 and 435, respectively, and adjacent the read sensor in central region 402. Note also that multi-layered seed layer structures 480 and 485 are formed upon the crystalline materials of the read sensor layers in end regions 404 and 406. In this embodiment, multi-layered seed layer structures 480 and 485 are formed directly on the extended pinning layer of AFM materials. However, seed layer structures 480 and 485 may be formed upon other layers of the read sensor which extend into end regions 404 and 406, such as a seed layer (not shown in FIG. 4) of the read sensor.

Typically, the crystalline materials of the read sensor include both magnetic materials and electrically conductive materials.

Multi-layered seed layer structure 480 has a first seed layer 482 corresponding to a bottom layer of multi-layered seed layer structure 480, a third seed layer 486 corresponding to a top layer of multi-layered seed layer structure 480 and a second seed layer 484 formed between the first and the third seed layers 482 and 486, respectively, of multi-layered seed layer structure 480. According to the invention, first seed layer 482 is made of chromium-molybdenum (Cr—Mo), second seed layer 484 is made of nickel-tantalum (Ni—Ta), and third seed layer 486 is made of chromium-molybdenum (Cr—Mo). Although not shown in FIG. 4, multi-layered seed layer structure 485 has the same first, second, and third seed layers as multi-layered seed layer structure 480. Preferably, each first seed layer 482 has a thickness of between 3-50 Angstroms, each second seed layer 484 has a thickness of between 3-100 Angstroms, and each third seed layer 486 has a thickness of between 20-200 Angstroms. Advantageously, the hard bias materials exhibit an increased coercivity and squareness. For example, hard bias layer 430 may have a coercivity of 1400 Oersteds (Oe) or higher.

Thus, the magnetic head has a read sensor formed in central region 402, multi-layered seed layer structures 480 and 485 formed in end regions 404 and 406 adjacent the read sensor and upon crystalline materials of the read sensor layers; and hard bias layers 430 and 435 formed over multi-layered seed layer structures 480 and 485. Each one of multi-layered seed layer structures 480 and 485 includes first seed layer 482 made of chromium-molybdenum (Cr—Mo), second seed layer 484 made of either nickel-tantalum (Ni—Ta) or top-surface-oxidized nickel-tantalum (Ni—Ta), and third seed layer 486 made of chromium-molybdenum (Cr—Mo).

Figure 5:
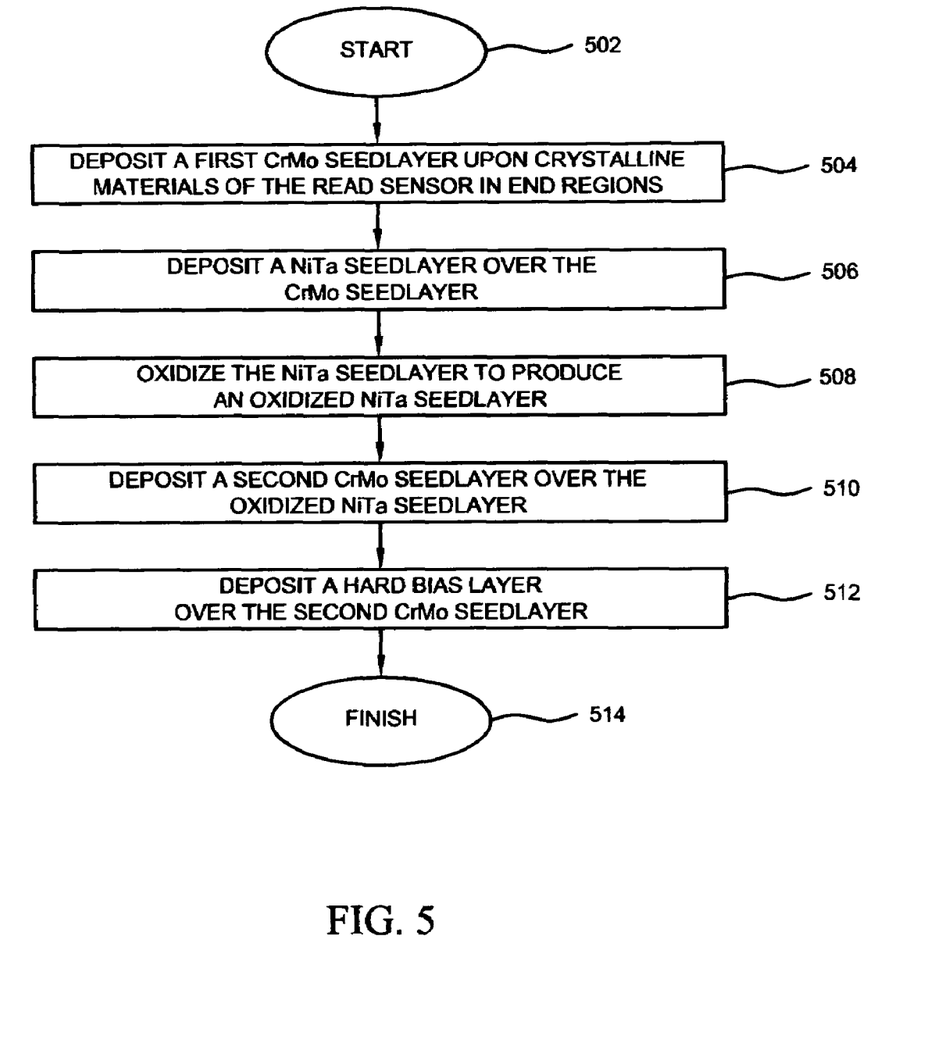
FIG. 5 is a flowchart describing a method of making an SV sensor according to the present invention.
Figure 6:
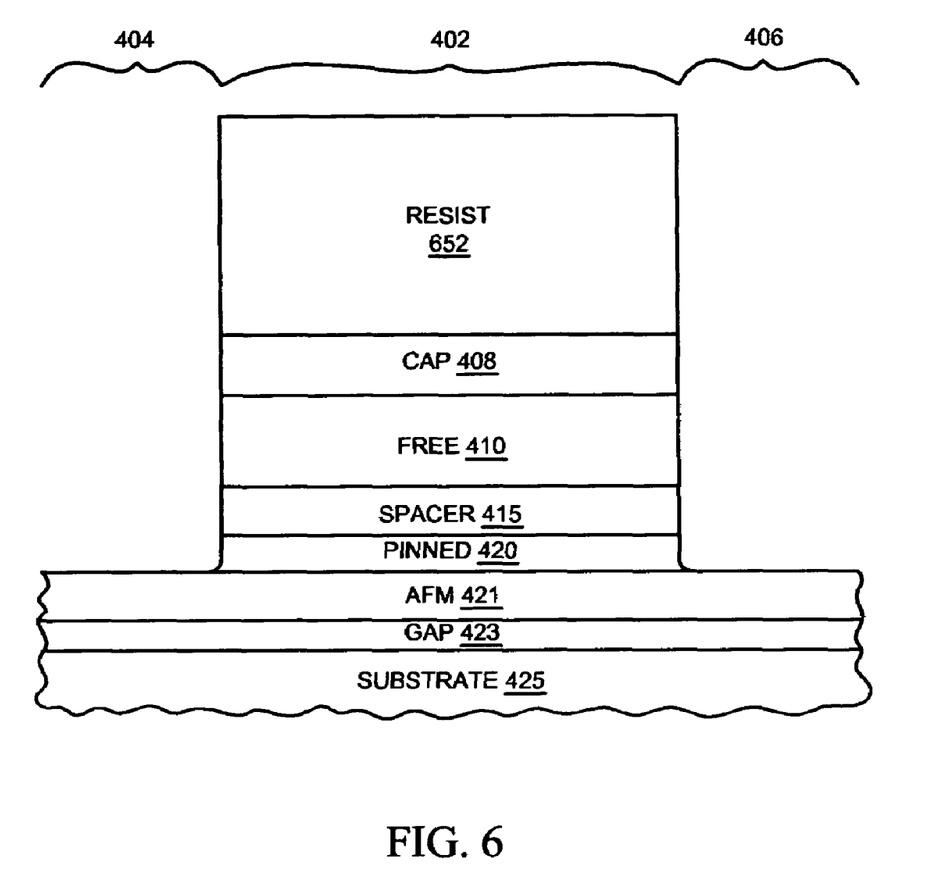
FIG. 6 shows an SV sensor at the processing step after ion milling definition of the central region of the sensor.

FIGS. 5-8 are illustrations relating to a preferred method of making the read sensor of FIG. 4 according to the present invention. Referring first to FIG. 6, however, a partially-constructed multi-layered spin valve (SV) sensor structure is shown, which illustrates the structure after the processing steps defining central region 402 of the sensor have been completed. To reach this stage of the processing in FIG. 6, the multi-layered SV sensor structure is deposited as is well established in the art. A resist without undercuts 652 is applied and patterned over the multi-layered SV sensor structure in a central region 402. Resist 652 is formed so as to not have any undercuts, but rather straight sidewalls from top to bottom; that is, the resist sidewalls are substantially normal to a plane defined by the previously deposited read sensor layers. Although resist 652 may be a monolayer resist (e.g. a monolayer photoresist), it may alternatively be a multi-layered resist (e.g. bilayer or trilayer resist) which is formed without undercuts. Further alternatively, resist 652 may be structured so as to have undercuts (e.g. a bilayer resist having undercuts).

In any case, resist 652 is formed with a suitable width so as to define an appropriate trackwidth (TW) for the SV sensor. Resist 652 masks the active region of the sensor during the ion beam milling and deposition process, for a multi-layered structure to be subsequently deposited in end regions 404 and 406. The layers formed under the resist have been protected during the ion milling process and remain intact. However, the portions of a pinned layer 420, a spacer layer 415, a free layer 410, and a capping layer 408 that are not protected by the resist during the ion milling process are removed in end regions 404 and 406 by the ion mill. The ion milling process can be stopped at any one of these layers.

Figure 7:
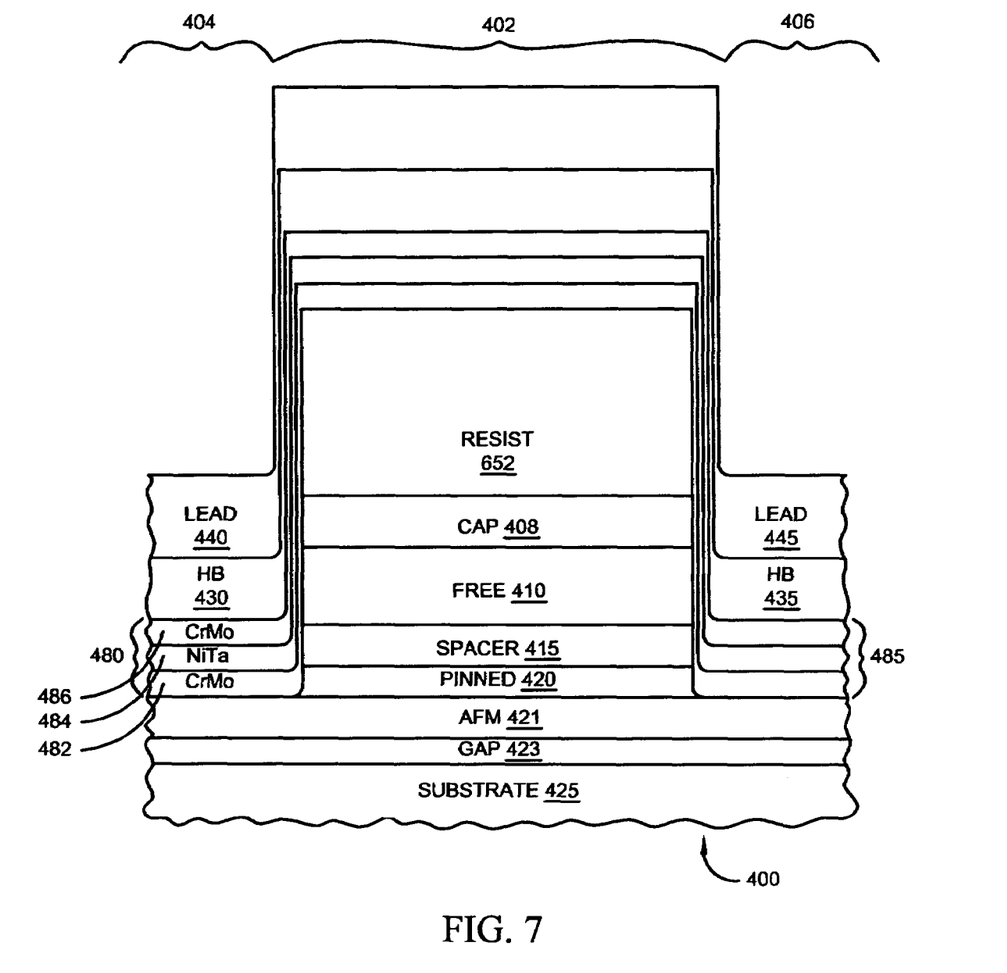
FIG. 7 shows an SV sensor after the processing steps of depositing the multi-layered seed layer structure, a hard biasing layer, and a conductor lead structure.

In FIG. 7, an SV sensor after a multi-layered seed layer structure 480, hard bias layers, and conductive lead layers have been deposited using ion beam sputtering deposition is shown. Beginning at a start block 502 of the flowchart of FIG. 5, in combination with the view of FIG. 7, a first seed layer 482 made of chromium-molybdenum (Cr—Mo) is deposited in the end regions adjacent the read sensor up n crystalline materials of the read sensor (step 504 of FIG. 5). Preferably, first seed layer 482 made of the Cr—Mo is deposited to a thickness between 3 to 50 Å, and preferably has a specific thickness of about 10 Å. First seed layer 482 made of the Cr—Mo is deposited so as to homogenize the type of surface subsequently deposited nickel-tantalum is formed on.

A second seed layer 484 made of nickel-tantalum (Ni—Ta) is then deposited over first seed layer 482 made of Cr—Mo (step 506 of FIG. 5). Preferably, second seed layer 484 made of the Ni—Ta is deposited to a thickness between about 3 to 100 Å, and preferably has a specific thickness of about 15 Å. In the preferred embodiment, second seed layer 484 made of the Ni—Ta is then oxidized by exposing its surface to oxygen (step 508 of FIG. 5). The oxidizing process is applied for a short period of time such that it does not increase the contiguous junction resistance by any significant amount. Advantageously, the oxidation process increases the squareness of the hard bias materials. Second seed layer 484 is exposed to a low level of oxygen using a $5 \times 10^{-5}$ Torr oxygen pressure for a time range of about 15 to 60 seconds, and preferably for about 30 seconds. By exposing the nickel-tantalum (Ni—Ta) surface to oxygen in this way, the surface microstructure of second seed layer 484 is changed resulting in an amorphous surface microstructure. As a result, second seed layer 484 acts as a buffer layer which disrupts the microstructural continuity between crystalline materials of the read sensor and subsequently deposited hard bias layer 430. This leads to improved squareness of the hard bias material.

Next, a third seed layer 486 made of chromium-molybdenum (Cr—Mo) is then deposited over oxidized second seed layer 484 made of the Ni—Ta (step 510 of FIG. 5). Preferably, third seed layer 486 is deposited to a thickness between 20 to 200 Å, and preferably has a specific thickness of about 50 Å. Third seed layer 486 is deposited to act as a seed layer which promotes necessary c-axis in plane orientation for increased coercivity of subsequently deposited hard bias layer 430.

A hard bias layer 430 is then deposited over third seed layer 486 made of the Cr—Mo (step 512 of FIG. 5). Preferably, hard bias layer 430 is a layer of suitable hard magnetic material, such as cobalt-platinum-chromium (Co—Pt—Cr). However, the hard magnet material may be any suitable cobalt-based alloy. The flowchart ends at a finish block 514 of FIG. 5, but additional conventional processing steps may be performed (such as depositing lead layers 440 and 445 over hard bias layers 430 and 435, respectively). Note that multi-layered seed layer structure 485 has the same first, second, and third seed layers as multi-layered seed layer structure 480.

Figure 8:
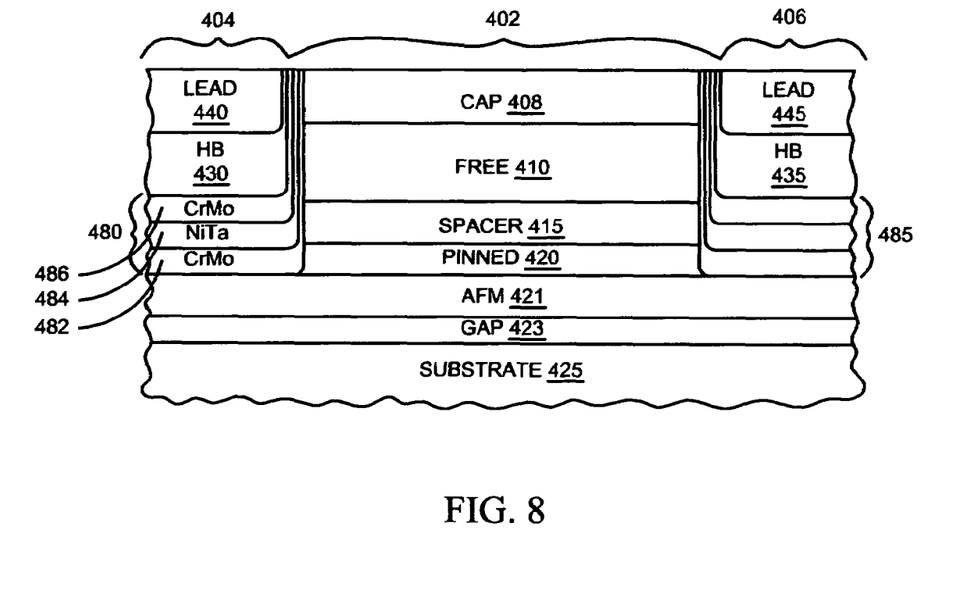
FIG. 8 shows an SV sensor having the multi-layered seed layer structure according to the present invention after the resist has been removed.

During the lead deposition process, lead layers 440 and 445 are formed over resist 652. In the next process step, a chemical-mechanical polishing (CMP) is performed over the structure to remove resist 652 and form a top planar surface. Alternatively, if resist 652 is formed with undercuts (e.g. a bilayer resist with undercuts), the resist may be removed by utilizing a suitable solvent. The result is the SV sensor structure of FIG. 8. As shown in FIG. 8, the SV sensor has an active SV structure formed in central region 402, and conductive lead layers 440 and 445 and hard bias layers 450 and 455 formed in end regions 404 and 406, respectively. Thin multi-layered seed layer structures 480 and 485 as described are formed below hard bias layers 430 and 435, respectively, in end regions 404 and 406.

Thus, by utilizing a multi-layered seed layer structure made of a first seed layer of chromium-molybdenum (Cr—Mo), a second seed layer of nickel-tantalum (Ni—Ta) (or top-surface-oxidized nickel-tantalum (Ni—Ta)), and a third seed layer of chromium-molybdenum (Cr—Mo) formed upon crystalline materials of the read sensor layers in end regions adjacent the read sensor, improved hard magnetic properties are exhibited by a hard bias layer. In particular, the hard bias layer exhibits increased coercivity and squareness. For example, the hard bias layer may have an increased coercivity of 1400 Oersteds (Oe) or higher.

More specifically, an inventive magnetic head having improved hard magnet properties includes a spin valve (SV) sensor; a multi-layered seed layer structure formed upon crystalline materials of the sensor in end regions adjacent the sensor; and a hard bias layer formed over the multi-layered seed layer structure. The multi-layered seed layer structure includes a first seed layer comprising chromium-molybdenum (Cr—Mo), a second seed layer comprising nickel-tantalum (Ni—Ta) top surface oxidized nickel-tantalum (Ni—Ta) and a third seed layer comprising chromium-molybdenum (Cr—Mo). The hard bias layer may be made from a cobalt-based alloy, such as cobalt-platinum-chromium (Co—Pt—Cr). The crystalline materials may include materials such as tantalum (Ta), nickel-iron (Ni—Fe), cobalt-iron (Co—Fe), copper (Cu), ruthenium (Ru), and platinum-manganese (Pt—Mn), as examples. A lead layer may be formed over the hard bias layer.

A hard disk drive may embody the magnetic head. This hard disk drive has at least one rotatable magnetic disk; a spindle supporting the at least one rotatable magnetic disk; a disk drive motor for rotating the at least one rotatable magnetic disk; a magnetic head for reading data from the at least one rotatable magnetic disk; and a slider for supporting the magnetic head. The magnetic head having improved hard magnet properties includes a SV sensor; a multi-layered seed layer structure formed upon crystalline materials of the sensor in end regions adjacent the sensor; and a hard bias layer formed over the multi-layered seed layer structure. The multi-layered seed layer structure includes a first seed layer made of chromium-molybdenum (Cr—Mo), a second seed layer made of nickel-tantalum (Ni—Ta) (or top-surface-oxidized nickel-tantalum (Ni—Ta)), and a third seed layer made of chromium-molybdenum (Cr—Mo). The hard bias layer may be made from a cobalt-based alloy, such as cobalt-platinum-chromium (Co—Pt—Cr). The crystalline materials of the sensor includes materials such as tantalum (Ta), nickel-iron (Ni—Fe), cobalt-iron (Co—Fe), copper (Cu), ruthenium (Ru), platinum-manganese (Pt—Mn), as examples. A lead layer may be formed over the hard bias layer.

Finally a method for use in forming a magnetic head includes forming a plurality of SV sensor layers over a substrate and forming a resist over the SV sensor in a central region. An act of milling, with the resist in place, to remove SV sensor materials in end regions adjacent the central region is performed. A multi-layered seed layer structure is then formed upon leftover crystalline materials of the sensor in the end regions. The multi-layered seed layer structure includes a first seed layer made of chromium-molybdenum (Cr—Mo), a second seed layer made of nickel-tantalum (Ni—Ta) (or top-surface-oxidized nickel-tantalum (Ni—Ta)), and a third seed layer comprising chromium-molybdenum (Cr—Mo). The hard bias layer may be made from a cobalt-based alloy, such as cobalt-platinum-chromium (Co—Pt—Cr). The crystalline materials of the sensor include materials such as tantalum (Ta), nickel-iron (Ni—Fe), cobalt-iron (Co—Fe), copper (Cu), ruthenium (Ru), and platinum-manganese (Pt—Mn), as examples A lead layer may be formed over the hard bias layer.

Advantageously, by utilizing a multi-layered seed layer structure made of a first seed layer of chromium-molybdenum (Cr—Mo), a second seed layer of nickel-tantalum (Ni—Ta) (or a top-surface-oxidized nickel-tantalum (Ni—Ta)), and a third seed layer of chromium-molybdenum (Cr—Mo) formed upon crystalline materials of the read sensor in the end regions, the hard bias material exhibits improved properties as compared to prior art seed layer structures formed over crystalline materials.

It is to be understood that the above is merely a description of preferred embodiments of the invention and that various changes, alterations, and variations may be made without departing from the true spirit and scope of the invention as set for in the appended claims. None of the terms or phrases in the specification and claims has been given any special particular meaning different from the plain language meaning to those skilled in the art, and therefore the specification is not to be used to define terms in an unduly narrow sense.

What is claimed is:

1. A magnetic head, comprising:
   a read sensor having a plurality of read sensor layers;
   the plurality of read sensor layers being formed in a central region, with some of the read sensor layers being formed in both the central region and in end regions adjacent the central region;
   a multi-layered seed layer structure formed upon crystalline materials of the read sensor layers in the end regions;
   the multi-layered seed layer structure including:
     a first seed layer comprising chromium-molybdenum (Cr—Mo);
     a second seed layer comprising nickel-tantalum (Ni—Ta);
     a third seed layer comprising chromium-molybdenum (Cr—Mo); and
   a hard bias layer formed over the multi-layered seed layer structure.

2. The magnetic head of claim 1, wherein the crystalline materials include at least one of magnetic materials and electrically conductive materials of the read sensor.

3. The, magnetic head of claim 1, wherein the crystalline materials comprise one of a pinning layer and a seed layer of the read sensor.

4. The magnetic head of claim 1, wherein a top surface of the second seed layer is oxidized to increase a coercivity and a squareness of the hard bias layer.

5. The magnetic head of claim 1, wherein:
   the first seed layer corresponds to a bottom layer of the multi-layered seed layer structure;
   the third seed layer corresponds to a top layer of the multi-layered seed layer structure; and
   the second seed layer is formed between the first and the second seed layers.

6. The magnetic head of claim 1, wherein the multi-layered seed layer structure includes:
   the first seed layer consisting of chromium-molybdenum (Cr—Mo);
   the second seed layer consisting of nickel-tantalum (Ni—Ta); and
   the third seed layer consisting of chromium-molybdenum (Cr—Mo).

7. The magnetic head of claim 1, wherein the hard bias layer is a cobalt-based alloy.

8. The magnetic head of claim 1, wherein the hard bias layer includes cobalt-platinum-chromium (Co—Pt—Cr).

9. The magnetic head of claim 1, wherein a coercivity is increased due to the hard bias layer formed over the multi-layered seed layer structure.

10. The magnetic head of claim 1, wherein the first seed layer has a thickness range of 3 to 50 Angstroms (Å), the second seed layer has a thickness range of 3 to 100 Å, the third seed layer has a thickness range of 20 to 200 Å and the hard bias layer produces a coercivity of about 1400 Gersteds (Oe) or higher.

11. The magnetic head of claim 1, further comprising:
a lead layer formed over the hard bias layer.

12. A hard disk drive, comprising:
at least one rotatable magnetic disk;
a spindle supporting the at least one rotatable magnetic disk;
a disk drive motor for rotating the at least one rotatable magnetic disk;
a magnetic head for reading data from the at least one rotatable magnetic disk;
a slider for supporting the magnetic head;
the magnetic head, comprising:
a read sensor having a plurality of read sensor layers;
the plurality of read sensor layers being formed in a central region, with some of the read sensor layers being formed in both the central region and in end regions adjacent the central region;
a multi-layered seed layer structure formed upon crystalline materials of the read sensor layers in the end regions;
the multi-layered seed layer structure including:
a first seed layer comprising chromium-molybdenum (Cr—Mo);
a second seed layer comprising nickel-tantalum (Ni—Ta);
a third seed layer comprising chromium-molybdenum (Cr—Mo);
and
a hard bias layer formed over the multi-layered seed layer structure.

13. The hard disk drive of claim 12, wherein the crystalline materials include at least one of magnetic materials and electrically conductive materials of the read sensor.

14. The hard disk drive of claim 12, wherein the crystalline materials comprise one of a pinning layer and a seed layer of the read sensor.

15. The hard disk drive of claim 12, wherein a top surface of the second seed layer is oxidized to increase a coercivity and a squareness of the hard bias layer.

16. The hard disk drive of claim 12, wherein:
the first seed layer corresponds to a bottom layer of the multi-layered seed layer structure;
the third seed layer corresponds to a top layer of the multi-layered seed layer structure; and
the second seed layer is formed between the first and the second seed layers.

17. The hard disk drive of claim 12, wherein the multi-layered seed layer structure includes:
the first seed layer consisting of chromium-molybdenum (Cr—Mo);
the second seed layer consisting of nickel-tantalum (Ni—Ta); and
the third seed layer consisting of chromium-molybdenum (Cr—Mo).

18. The hard disk drive of claim 12, wherein the hard bias layer is a cobalt-based alloy.

19. The hard disk drive of claim 12, wherein the hard bias layer includes cobalt-platinum-chromium (Co—Pt—Cr).

20. The hard disk drive of claim 12, wherein a coercivity is increased due to the hard bias layer formed over the multi-layered seed layer structure.

21. The hard disk drive of claim 12, wherein the first seed layer has a thickness range of 3 to 50 Angstroms (Å), the second seed layer has a thickness range of 3 to 100 Å, the third seed layer has a thickness range of 20 to 200 Å, and the hard bias layer produces a coercivity of about 1400 Gersteds (Oe) or higher.

22. The hard disk drive of claim 12, further comprising:
a lead layer formed over the hard bias layer.

23. A method for use in forming a magnetic head, comprising:
forming a plurality of read sensor layers;
forming a resist over the read sensor layers in a central region;
etching, with the resist in place, to remove read sensor materials of the read sensor layers in end regions adjacent the central region for forming a read sensor in the central region, while leaving some of the read sensor layers in both the central region and the end region;
forming a multi-layered seed layer structure upon crystalline materials of the read sensor layers in the end regions;
the multi-layered seed layer structure including:
a first seed layer comprising chromium-molybdenum (Cr—Mo);
a second seed layer comprising nickel-tantalum (Ni—Ta);
a third seed layer comprising chromium-molybdenum (Cr—Mo); and
a hard bias layer formed over the multi-layered seed layer structure.

24. The method of claim 23, wherein the crystalline materials include one of magnetic materials and electrically conductive materials of the read sensor.

25. The method of claim 23, wherein the crystalline materials comprise one of a seed layer and a pinning layer of the read sensor.

26. The method of claim 23, further comprising:
oxidizing a top surface of the second seed layer to increase a coercivity and a squareness of the hard bias layer.

27. The method of claim 23, wherein:
the first seed layer corresponds to a bottom layer of the multi-layered seed layer structure;
the third seed layer corresponds to a top layer of the multi-layered seed layer structure; and
the second seed layer is formed between the first and the second seed layers.

28. The method of claim 23, wherein the multi-layered seed layer structure includes:
the first seed layer consisting of chromium-molybdenum (Cr—Mo);
the second seed layer consisting of nickel-tantalum (Ni—Ta); and
the third seed layer consisting of chromium-molybdenum (Cr—Mo).

29. The method of claim 23, wherein the hard bias layer is a cobalt-based alloy.

30. The method of claim 23, wherein the hard bias layer includes cobalt-platinum-chromium (Co—Pt—Cr).

31. The method of claim 23, wherein a coercivity is increased due to the hard bias layer formed over the multi-layered seed layer structure.

32. The method of claim 23, wherein the first seed layer has a thickness range of 3 to 50 Angstroms (Å), the second seed layer has a thickness range of 3 to 100 Å, the third seed layer has a thickness range of 20 to 200 Å and the hard bias layer produces a coercivity of about 1400 Oersteds (Oe) or higher.

33. The method of claim 23, further comprising: forming a lead layer over the hard bias layer.

* * * * *

UNITED STATES PATENT AND TRADEMARK OFFICE
CERTIFICATE OF CORRECTION

| | |
|---|---|
| PATENT NO. | : 7,428,129 B2 |
| APPLICATION NO. | : 10/881062 |
| DATED | : September 23, 2008 |
| INVENTOR(S) | : Pinarbasi |

It is certified that error appears in the above-identified patent and that said Letters Patent is hereby corrected as shown below:

In column 12 at line 10: please delete "Gersteds" and replace with --Oersteds--

Signed and Sealed this

Eleventh Day of November, 2008

JON W. DUDAS
*Director of the United States Patent and Trademark Office*